(12) United States Patent
Julien et al.

(10) Patent No.: US 11,121,042 B2
(45) Date of Patent: Sep. 14, 2021

(54) PRODUCTION OF SEMICONDUCTOR REGIONS IN AN ELECTRONIC CHIP

(71) Applicant: STMicroelectronics (Rousset) SAS, Rousset (FR)

(72) Inventors: Franck Julien, La Penne sur Huveaun (FR); Frédéric Chairat, Saint maximin la ste (FR); Noémie Blanc, Pourrieres (FR); Emmanuel Blot, Seillons Source d'Argens (FR); Philippe Roux, Marseilles (FR); Gerald Theret, Aix-en-Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/739,592

(22) Filed: Jan. 10, 2020

(65) Prior Publication Data
US 2020/0152523 A1    May 14, 2020

Related U.S. Application Data

(62) Division of application No. 15/993,922, filed on May 31, 2018, now Pat. No. 10,553,499.

(30) Foreign Application Priority Data

Jun. 12, 2017 (FR) ...................................... 1755226

(51) Int. Cl.
*H01L 21/8238*    (2006.01)
*H01L 21/02*      (2006.01)
(Continued)

(52) U.S. Cl.
CPC .. *H01L 21/823878* (2013.01); *H01L 21/0217* (2013.01); *H01L 21/306* (2013.01);
(Continued)

(58) Field of Classification Search
CPC ......... H01L 21/823878; H01L 21/0217; H01L 21/84; H01L 21/31155; H01L 21/76283; H01L 21/306; H01L 29/0653
See application file for complete search history.

(56) References Cited

U.S. PATENT DOCUMENTS 7,282,402 B2    10/2007  Sadaka et al.
2002/0009851 A1 *  1/2002 Shukuri ............ H01L 21/28185
                                              438/257

(Continued)

FOREIGN PATENT DOCUMENTS

EP    2037496 A1    3/2009
JP    2000200836 A  7/2000

OTHER PUBLICATIONS

Office Action, U.S. Appl. No. 15/992,481, dated May 1, 2019.

*Primary Examiner* — Dung A. Le
(74) *Attorney, Agent, or Firm* — Slater Matsil, LLP

(57) ABSTRACT

A method can be used for fabricating first and second semiconductor regions separated by isolating trenches. A semiconductor substrate is covered with silicon nitride. The silicon nitride situated above the first region is doped by ion implantation. Trenches are etched through the silicon nitride and the doped silicon nitride is partially etching in an isotropic manner. The trenches are filled with an insulator to a level situated above that of the first region. The silicon nitride is removed resulting in the edges of the first region only being covered with an insulator annulus.

20 Claims, 4 Drawing Sheets

(51) Int. Cl.
 *H01L 21/84* (2006.01)
 *H01L 27/092* (2006.01)
 *H01L 21/3115* (2006.01)
 *H01L 21/762* (2006.01)
 *H01L 21/306* (2006.01)
 *H01L 29/06* (2006.01)
 *H01L 27/12* (2006.01)
 *H01L 21/311* (2006.01)
 *H01L 27/11521* (2017.01)

(52) U.S. Cl.
 CPC ... *H01L 21/31111* (2013.01); *H01L 21/31155* (2013.01); *H01L 21/76224* (2013.01); *H01L 21/76283* (2013.01); *H01L 21/84* (2013.01); *H01L 27/092* (2013.01); *H01L 27/1203* (2013.01); *H01L 27/1211* (2013.01); *H01L 29/0653* (2013.01); *H01L 27/11521* (2013.01)

(56) References Cited

U.S. PATENT DOCUMENTS

| | | |
|---|---|---|
| 2004/0065937 A1 | 4/2004 | Hsiao |
| 2005/0061768 A1 | 3/2005 | Fucsko et al. |
| 2005/0153560 A1 | 7/2005 | Enomoto |
| 2005/0269637 A1 | 12/2005 | Iwamatsu et al. |
| 2006/0030136 A1* | 2/2006 | Chen ............... H01L 21/76232 438/585 |
| 2006/0228851 A1 | 10/2006 | Sadaka et al. |
| 2007/0077723 A1 | 4/2007 | Ahn |
| 2011/0062527 A1* | 3/2011 | Shino ............. H01L 21/823814 257/369 |
| 2012/0256268 A1 | 10/2012 | Li et al. |
| 2013/0178045 A1 | 7/2013 | Tan et al. |
| 2014/0113419 A1 | 4/2014 | Scheiper et al. |
| 2019/0006229 A1 | 1/2019 | Julien |

* cited by examiner

PRODUCTION OF SEMICONDUCTOR REGIONS IN AN ELECTRONIC CHIP

CROSS-REFERENCE TO RELATED APPLICATIONS

This application is a divisional application of U.S. application Ser. No. 15/993,922, filed on May 31, 2018, which claims priority to French Application No. 1755226, filed on Jun. 12, 2017, which applications are hereby incorporated herein by reference in their entirety.

This application is related to U.S. patent application Ser. No. 15/992,481, which claims priority to French Patent Application No. 1756181.

TECHNICAL FIELD

The present patent application relates to a method for producing semiconductor regions in an electronic chip.

BACKGROUND

Diverse problems can arise in an electronic chip comprising field-effect transistors.

In particular, one problem in such transistors is that, in general, the smaller the transistors, the higher, in relative value, the leakage current. This results in high energy consumption.

Another problem is that, when several transistors are designed to be identical, these transistors in fact generally exhibit different electrical characteristics, in particular different threshold voltages. The differences between these electrical characteristics usually tend to get worse when the operating temperature decreases. This results in diverse difficulties in actually obtaining the envisaged electrical characteristics. These difficulties arise particularly in the case where the chip is provided for analogue operation, for example, in a measurement device, and/or for cold operation, for example, at negative ambient temperature. This usually leads to certain chips being rejected during post-fabrication checking.

Moreover, an electronic chip can comprise memory points of floating gate transistor type, surmounted by a control gate. In addition to the above-mentioned problems in respect of the transistors, such memory points exhibit problems of degradation of the transistor's gate insulator due to the fact that relatively high voltages are required to be applied for the programming of the memory points.

The diverse known methods for solving the diverse problems mentioned hereinabove require numerous fabrication steps if it is desired to implement them simultaneously for different types, N-channel and P-channel, of transistors and/or of memory points.

SUMMARY

The present patent application relates to a method for producing semiconductor regions in an electronic chip, for example, semiconductor regions intended for the formation of N-channel and P-channel transistors and/or memory points. Embodiments can mitigate all or some of the drawbacks described above.

One embodiment provides a method for fabricating first and second semiconductor regions separated by isolating trenches. A semiconductor substrate is covered with silicon nitride. The silicon nitride situated above the first region is doped by ion implantation. Trenches are etched through the silicon nitride and the doped silicon nitride is partially etching in an isotropic manner. The trenches are filled with an insulator to a level situated above that of the first region. The silicon nitride is removed resulting in the edges of the first region only being covered with an insulator annulus.

According to one embodiment, the method further comprises a step of cleaning the structure obtained after removing the silicon nitride. This cleaning can result in the formation of pits on the surface of the insulator around the second region.

According to one embodiment, the silicon nitride has a thickness of between 80 and 200 nm, and the ion implantation is carried out with an energy of greater than 60 keV.

According to one embodiment, the implanted ions are chosen in the group comprising argon and phosphorus.

According to one embodiment, the partial etching removes a thickness of silicon nitride of between 2 and 15 nm, and the trenches are filled to a level is between 1 and 10 nm above that of the first region.

According to one embodiment, the partial etching is carried out by a solution comprising phosphoric acid.

According to one embodiment, the substrate is the upper semiconductor layer of an SOI structure.

According to one embodiment, the substrate is a bulk substrate.

The method can simultaneously fabricate an N-channel transistor and of a P-channel transistor. Before forming the silicon nitride, a P-type doping step is performed the first region and N-type doping is performed in the second region. After removing the silicon nitride, the P-channel transistor is formed in and on the second region and the N-channel transistor is formed in and on the first region.

One embodiment provides a device comprising first and second semiconductor regions separated by trenches filled with an insulator. The edges of the first region are only covered with an annulus of the insulator.

According to one embodiment, the surface of the insulator forms pits around the second regions.

One embodiment provides an electronic chip comprising a device such as hereinabove. An N-channel transistor is located in and on the first region and a P-channel transistor is located in and on the second region.

BRIEF DESCRIPTION OF THE DRAWINGS

These features and advantages, and others, will be described in detail in the following non-limiting description of particular embodiments, which is given with reference to the appended figures, in which.

DETAILED DESCRIPTION OF ILLUSTRATIVE EMBODIMENTS

The various figures have not been drawn to scale and, in addition, in the various figures, elements that are the same have been referenced by the same references. For the sake of clarity, only those elements which are useful to the comprehension of the described embodiments have been shown and are described in detail. In particular, diverse elements of the transistors, such as spacers, are not represented.

In the description which follows, when making reference to position qualifiers such as the terms, "left", "right", "above", "upper", "lower", etc., reference is made to the orientation of the element concerned in the figures considered, it being understood that, in practice, the devices described may be oriented differently.

FIGS. 1A to 1E are partial and schematic sectional views illustrating steps of a method for fabricating a P-channel transistor.

Figure 1A:
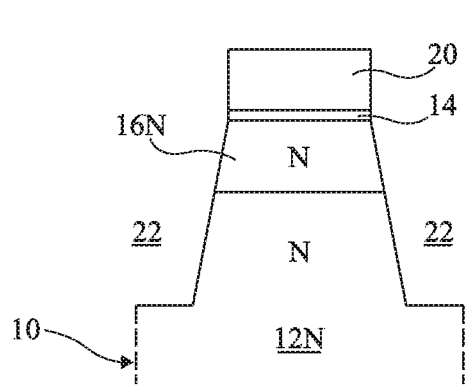
FIGS. 1A to 1E are partial and schematic sectional views illustrating steps of a method for fabricating a P-channel transistor.

In the step of FIG. 1A, a semiconductor substrate 10 comprises by way of example an N-type doped well 12N. In the upper part of the well 12N, an N-type doped region 16N has been formed, and its doping level has been selected as a function of the desired electrical characteristics of the transistor. By way of variant, the well 12N and the region 16N will be formed in later steps of the method. The substrate is covered with a fine silicon oxide layer 14, of thickness typically between 2 and 20 nm. A silicon nitride layer 20 is thereafter deposited on the structure, and then trenches 22 are etched through the silicon nitride (only halves of the trenches are visible in the figures). The trenches penetrate into the substrate and delimit a portion of the region 16N.

Figure 1B:
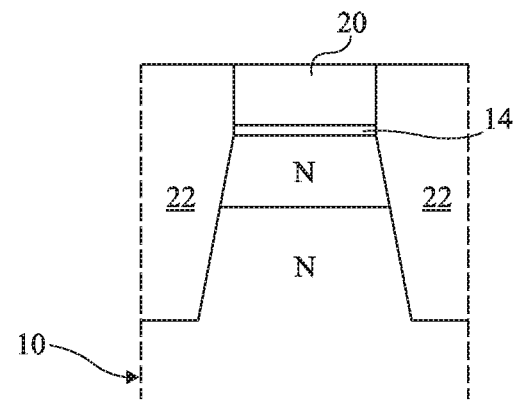

In the step of FIG. 1B, the trenches are filled with an insulator, for example silicon oxide, to the upper level of the silicon nitride 20.

Figure 1C:
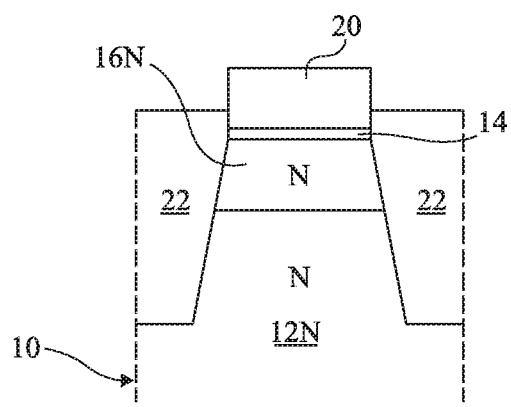

In the step of FIG. 1C, the insulator of the trenches 22 is selectively etched with respect to the silicon nitride 20, for example to a level situated above that of the region 16N.

Figure 1D:
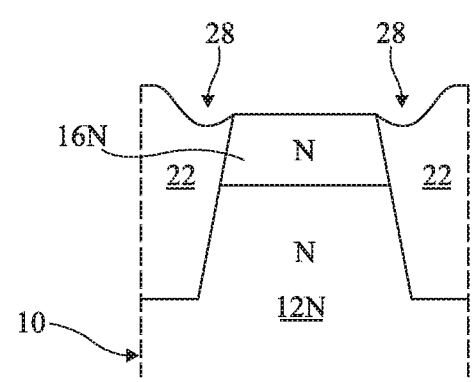

In the step of FIG. 1D, the silicon nitride is removed by selective etching with respect to the insulator of the trenches 22. The layer 14 then protects the region 16N. The structure is thereafter cleaned, so as to eliminate the oxide of the layer 14, still present on the region 16N. This cleaning is for example carried out in a solution based on hydrofluoric acid. This cleaning causes the formation of pits 28 on the surface of the insulator of the trenches around the region 16N.

Figure 1E:
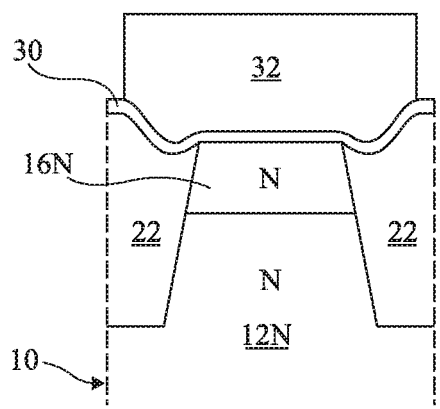

In the step of FIG. 1E, a P-channel MOS transistor has been formed in and on the region 16N. In particular, a gate insulator layer 30 and a gate 32 have been formed.

Figure 1F:
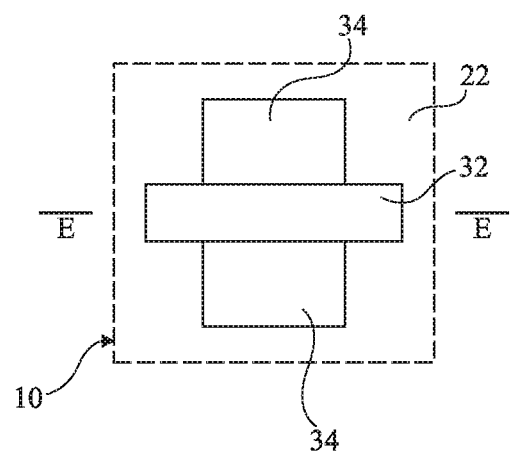
FIG. 1F is a plan view from above of the structure of FIG. 1E.

FIG. 1F is a view from above of the structure of FIG. 1E. The insulating layer 30 is not represented. Viewed from above, the gate 32 extends over the width of the region 16N. Drain and source regions 34 have been formed on each side of the gate in the region 16N.

Figure 2A:
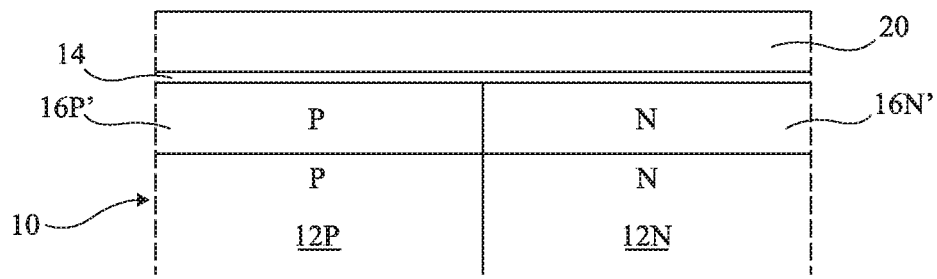
FIGS. 2A to 2H are partial and schematic sectional views illustrating steps of an embodiment of a method for fabricating an N-channel transistor and a P-channel transistor.
Figure 2B:
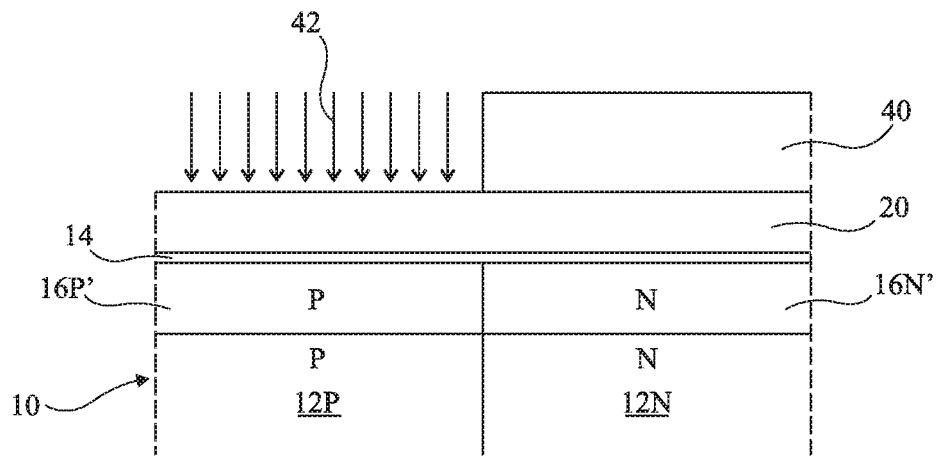
Figure 2C:
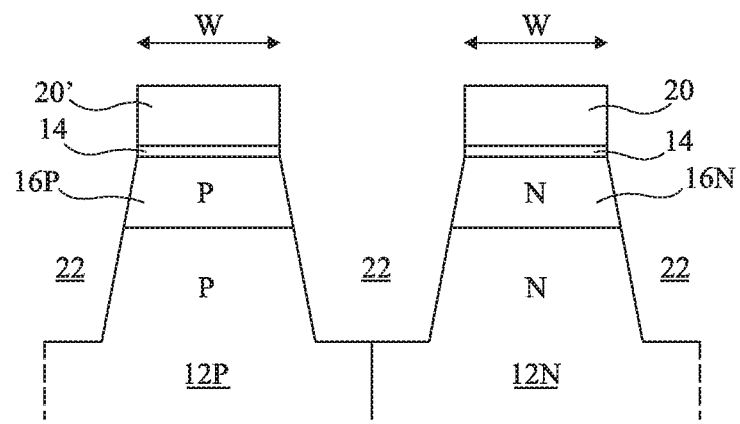
Figure 2D:
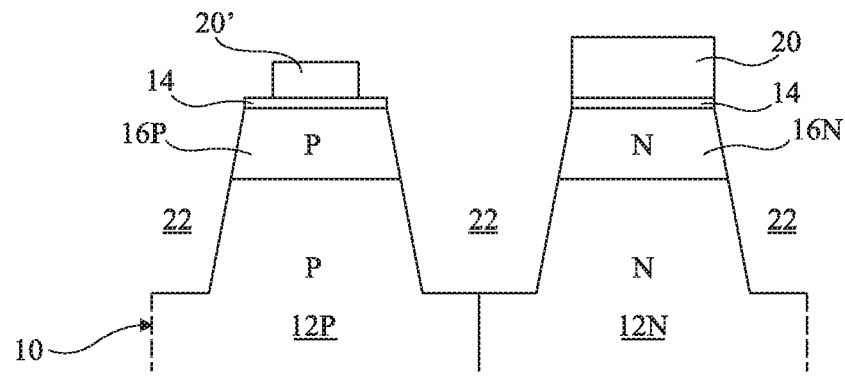

The parameters of the method hereinabove, in particular the etching of the insulator of the trenches 22 in the step of FIG. 2C and the cleaning in the step of FIG. 2D, are tailored so as to optimize the electrical characteristics of the transistor, for example to minimize its leakage current. This tailoring is for example carried out by trials. Indeed, the electrical characteristics, such as the threshold voltage and the leakage current, are different at the edges and at the center of the transistor because of diverse edge effects. Tailoring the parameters of the method makes it possible to obtain a pit shape which reduces these edge effects.

A method making it possible to obtain a P-channel transistor of optimal electrical characteristics has been described hereinabove. However, this method is not suitable for obtaining an N-channel transistor of optimal electrical characteristics. Indeed when the region 16 is no longer an N-type region 16N, but a P-type region 16P, the dopant atoms of type P, especially when dealing with boron, tend to migrate in the insulator, for example silicon oxide, of the trenches 22 in the course of the diverse annealing steps provided for in the method. It follows from this that the doping level of the peripheral parts of the region 16P in contact with the trenches 22 is lower than at the center of the region 16P, and is so in an irregular manner. Hence, when the method of FIGS. 1A to 1E is implemented to obtain several N-channel transistors designed to be identical, the peripheral parts with decreased doping are a cause of differences between the electrical characteristics of the transistors.

FIGS. 2A to 2H are partial and schematic sectional views illustrating steps of an embodiment of a method for fabricating an N-channel transistor on the left side of the figures and of a P-channel transistor on the right side. This method makes it possible to optimize the electrical characteristics of the P-channel transistors and of the N-channel transistors, and to reduce the differences between transistors designed to be identical.

In the step of FIG. 2A, a substrate 10 has been provided. The substrate 10 is here by way of example a bulk semiconductor substrate, of silicon for example. The left part of the substrate portion represented is a P-type doped well 12P. The right part of the substrate portion represented is an N-type doped well 12N. By way of variant, the substrate may be a semiconductor layer covering an insulating layer on a support, that is to say the upper semiconductor layer of an SOI ("Silicon On Insulator") structure.

Preferably a P-type doped layer 16P' and an N-type doped layer 16N' are implanted in the substrate on the left and right sides, respectively. The doping levels of the layer 16P' and of the layer 16N' are, for example, greater than 1017 atoms/cm$^3$. In the variant where the substrate is a thin layer of monocrystalline silicon covering the insulating layer of an SOI structure, the layers 16P' and 16N' can extend throughout the thickness of the thin monocrystalline silicon layer.

By way of variant, the wells 12P, the wells 12N, the regions 16P and/or the regions 16N can be doped in later steps of the method instead of being doped starting from the step of FIG. 2A.

Preferably, the substrate is covered with a silicon oxide layer 14 of thickness for example of between 2 and 20 nm.

After this, a silicon nitride layer 20 is deposited on the substrate. The silicon nitride layer 20 preferably has a thickness of between 80 and 200 nm.

In the step of FIG. 2B, the location of the P-channel transistor has been covered with a masking layer, for example, a photosensitive resin layer 40. This layer is removed at the location of the N-channel transistor.

An implantation in the silicon nitride (arrows 42) is then undertaken at the location of the N-channel transistor. The implanted atoms are for example argon and/or phosphorus atoms. It is also possible to use other types of atoms. The implantation energy is chosen so as to be able to reach all of the nitride layer 20, and more particularly its lower part. In the case of a layer of thickness of between 80 and 200 nm, the implantation energy is for example between 10 and 100 keV, preferably between 60 and 90 keV. The number of atoms implanted in the silicon nitride is sufficient to render the implanted nitride selectively etchable with respect to the non-implanted nitride. The rate of attack of the nitride varies as a function of the type of atoms implanted and also as a function of the modification of the crystal lattice of the nitride that the implantation induces.

In the step of FIG. 2C, the masking layer 40 is removed. Thereafter, trenches 22 are etched, passing fully through the silicon nitride 20 and the layers 16P' and 16N'. The trenches 22 delimit a semiconductor region 16P in the layer 16P' and a semiconductor region 16N in the layer 16N'. The trenches 22 surround the regions 16P and 16N. A portion of doped silicon nitride 20' entirely covering the region 16P and a portion of undoped silicon nitride 20 entirely covering the region 16N are obtained. The distance between the neighboring trenches corresponds to the width W of the future transistors (the length corresponding to the drain-source direction of the transistors) and is, for example, between 10 nm and several tens of μm.

In the step of FIG. 2D, an isotropic etching of the silicon nitride is undertaken. By way of example, the etching is carried out by a phosphoric acid solution. The doped silicon nitride 20' is etched more rapidly than the undoped silicon nitride 20, typically from 10 to 100 times more rapidly. The parameters of the etching (e.g., the composition and the concentration of the solution, the duration and the temperature of the etching) are chosen so as to remove a thickness of doped silicon nitride 20' of, for example, between 2 and several tens of nm, preferably between 2 and 15 nm, depending on the size of the transistors.

Figure 2E:
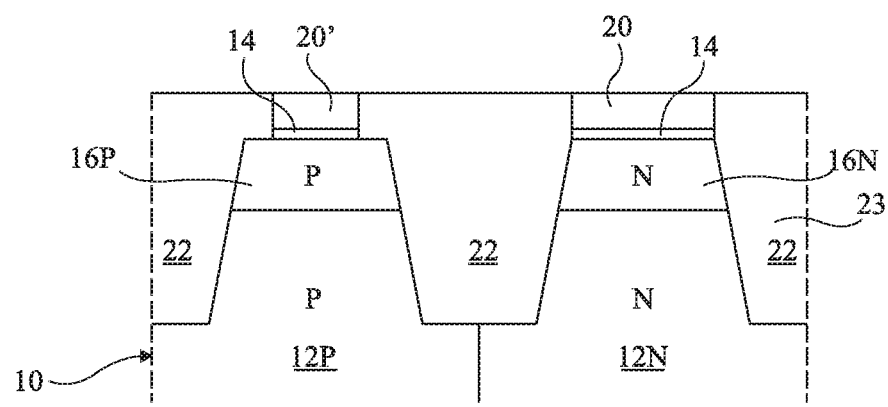

In the step of FIG. 2E, the trenches 22 are filled in with an insulator 23, for example silicon oxide, to the upper level of the silicon nitride 20, 20'.

Figure 2F:
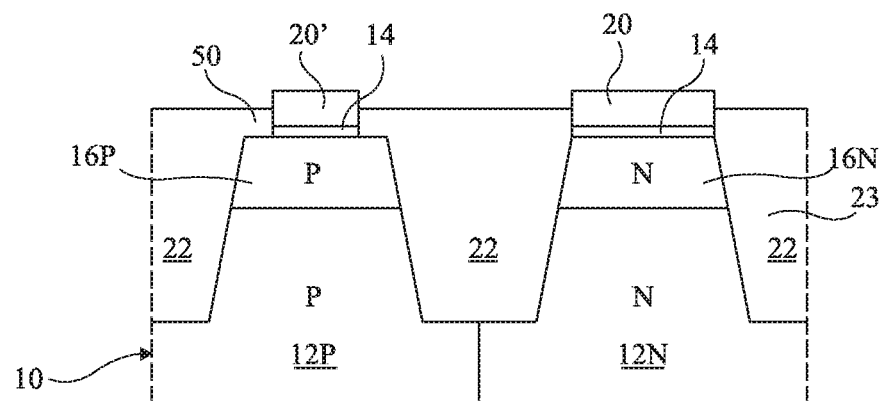

In the step of FIG. 2F, the insulator of the isolation trenches is etched selectively to a level situated above that of the region 16P, for example by a solution based on hydrofluoric acid. An insulator annulus 50 thus remains above the periphery of the regions 16P, around the nitride pad 20'. The parameters of the etching are chosen so that the thickness of the insulator annulus 50 remaining on the edges of the region 16P is for example, between 1 and several tens of nm, preferably between 1 and 10 nm.

Figure 2G:
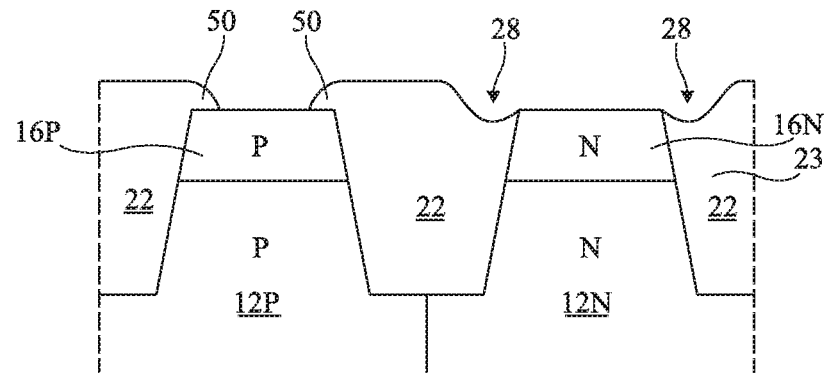

In the step of FIG. 2G, the silicon nitride is removed, for example by a solution based on phosphoric acid. The structure is thereafter cleaned, for example in a solution based on hydrofluoric acid. Pits 28 are obtained around the N-regions 18, and the insulator annulus 50 is preserved on the edges of the regions 16P.

Figure 2H:
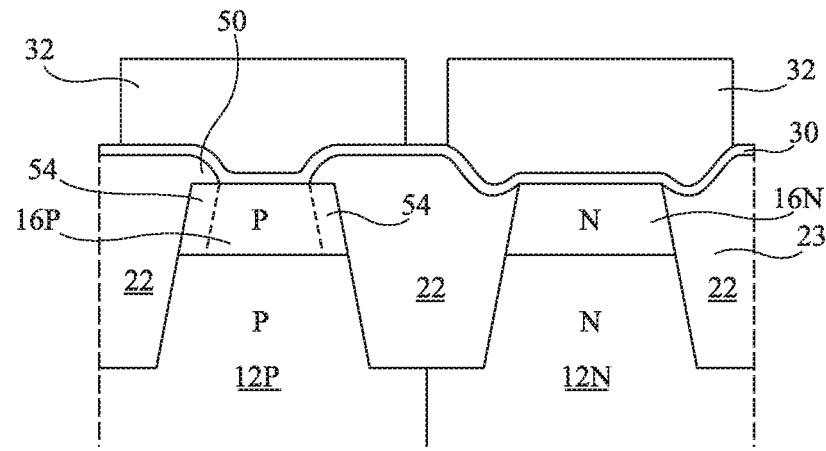

In the step of FIG. 2H, the N-channel and P-channel transistors in and on respectively the regions 16P and 16N are produced. In particular, a gate insulator layer 30 and the gates 32 are formed. By way of example, the gate insulator is formed by thermal oxidation and/or by deposition. The gate insulator can comprise a material with high dielectric permittivity such as, for example, hafnium oxide.

Figure 2I:
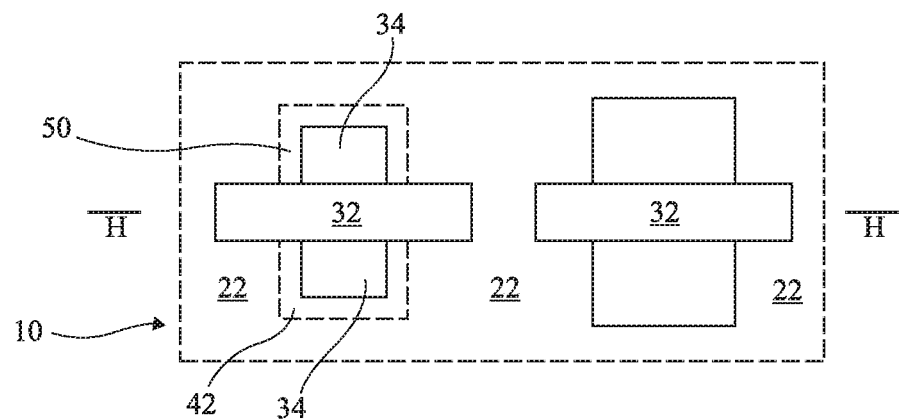
FIG. 2I is a plan view from above of the structure of FIG. 2H.

FIG. 2I is a schematic view from above of the structure of FIG. 2H, in which the gate insulator is not represented. The gates 32 extend across the regions 16P and 16N between drain and source regions 34. In the case of transistors formed side by side, the gate may be common to two transistors.

As indicated previously, when the region 16 is no longer an N-type region 16N, but a P-type region 16P, the dopant atoms of type P, especially when dealing with boron, tend to migrate in the insulator, for example silicon oxide, of the trenches 22 in the course of the diverse annealings provided for in the method. It follows from this that the doping level of the peripheral parts of the region 16P in contact with the trenches 22 is lower than at the center of the region 16P, and is so in an irregular manner. These more lightly doped peripheral regions are indicated by the reference 54 in FIG. 2H. They are covered by the insulator annulus 50. Thus, the thickness of insulator under the gate is greater at the edges of the channel region, and the gate 30 is active only above the central part with homogeneous doping of the regions 16P. An optimized N-channel transistor is thus obtained in a simple manner and in a particularly reduced number of steps.

The parameters of the method, in particular the etching of the doped silicon nitride 20' of the step of FIG. 2D, the etching the insulator of the trenches 22 of the step of FIG. 2F, and the cleaning of the step of FIG. 2G, can be tailored so as to obtain at one and the same time optimal electrical characteristics for the P-channel transistor and for the N-channel transistor, and to obtain particularly reduced differences between transistors designed to be identical.

According to one advantage, N-channel and P-channel transistors of optimized characteristics are obtained in a particularly reduced number of steps, and in a simple manner. Furthermore, the advantage of reliability of the method of FIGS. 1A to 1F, related to the fact that the portions 42 are auto-aligned, is preserved.

According to another advantage, an N-channel transistor and a P-channel transistor exhibiting particularly low leakage currents, even for small transistors, are obtained simultaneously. This results in particularly low energy consumption, in particular for a chip comprising such transistors.

According to another advantage, when using this method to produce, in addition to the P-channel transistor, several N-channel transistors designed to be identical, N-channel transistors whose electrical characteristics are quasi-identical, including under cold operation, are obtained. Therefore, this method exhibits particular interest in respect of the production of transistors intended to be used in a measurement device. Furthermore, this results in a particularly high fabrication efficiency.

Particular embodiments have been described. Various variants and modifications will be apparent to those skilled in the art. In particular, the method can be adapted to simultaneously produce transistors which differ for example by their gate insulator thickness and/or by their gate insulator materials. For this purpose, the gate insulator layer 30 formed in the step of FIG. 2H may have thicknesses and/or be made of materials which differ at the locations of the various transistors. It is thus possible to obtain transistors which differ by their threshold voltages and/or their voltages of use. Moreover, the transistors can then be of the same channel type, although the production of P-channel N-channel transistors has been described.

Furthermore, although the embodiments described hereinabove relate to the fabrication of transistors, the methods described can be adapted for the fabrication of other components, for example for the fabrication of memory points. Accordingly, in the step of FIG. 2H, the gates of the transistors are covered with an insulating layer, not represented, this insulating layer comprising for example a silicon nitride layer between two silicon oxide layers, and a gate (not represented) is formed on this insulating layer. This gate thus constitutes a control gate for the memory point, the gate 32 constituting a floating gate of the memory point. By way of variant, a transistor and another component, such as a memory point, can also be formed simultaneously. The two components may be of the same channel type or of different channel types.

What is claimed is:
1. A semiconductor device comprising:
   a semiconductor substrate having a first region and a second region that are surrounded by trenches;
   an insulating material filling the trenches, wherein edges of an upper surface of the first region are covered by a portion of the insulating material that fills the trenches and wherein the insulating material that fills the trenches is filled to a level below edges of the second region at a location adjacent the edges;
a dielectric layer overlying the first region, the second region and the insulating material including the portion of the insulating material that covers the edges of the upper surface of the first region, wherein the dielectric layer includes a first gate dielectric region overlying the first region and a second gate dielectric region overlying the second region;
a first gate region overlying and insulated from the first region by the first gate dielectric region, the first gate region spaced from the edges of the first region by the insulating material; and
a second gate region overlying and insulated from the second region by the second gate dielectric region, the second gate region including a portion that extends below a level of an upper surface of the second region.

2. The device according to claim 1, wherein the first region is a p-doped region and the second region is an n-doped region.

3. The device according to claim 1, wherein the first region is a p-doped region and the first gate region is a gate of an n-channel transistor; and
wherein the second region is an n-doped region and second gate region is a gate of a p-channel transistor.

4. The device according to claim 1, wherein the semiconductor substrate is an upper semiconductor layer of an SOI structure.

5. A semiconductor device comprising:
a n-channel transistor comprising
a first doped region of a first doping type disposed in a semiconductor substrate;
a second doped region surrounding the first doped region, the second doped region comprising a doping less than the first doped region and having the first doping type;
a first plurality of trenches disposed in the semiconductor substrate and surrounding the second doped region, the first plurality of trenches comprising an annular portion covering a top surface of the second doped region;
a first gate dielectric disposed over the first doped region, the first gate dielectric disposed over the annular portion; and
a first gate disposed over the first gate dielectric;
a p-channel transistor comprising
a third doped region of a second doping type disposed in the semiconductor substrate, the first doping type being opposite doping type to the second doping type;
a second plurality of trenches disposed in the semiconductor substrate and surrounding the third doped region, the second plurality of trenches comprising a pit region surrounding the third doped region;
a second gate dielectric disposed over the third doped region, the second gate dielectric disposed over the pit region; and
a second gate disposed over the second gate dielectric.

6. The device of claim 5, wherein the n-channel transistor comprises a first width, wherein p-channel transistor comprises a second width, and wherein the first width is smaller than the second width.

7. The device of claim 6, wherein the first doped region comprises the first width, and wherein the third doped region comprises the second width.

8. The device of claim 7, wherein the first doped region and the second doped region together comprise the second width.

9. The device of claim 5, wherein the first plurality of trenches and the second plurality of trenches comprise a common trench that comprises a part of the annular portion and a part of the pit region.

10. The device of claim 5, wherein the first plurality of trenches comprises a first trench and a second trench and the second plurality of trenches comprise a third trench and the second trench.

11. A semiconductor device comprises:
a first transistor comprising
a first active region surrounded by a first doped region, the first doped region having a lower doping than the first active region;
a first isolation region disposed around the first doped region and comprising an annular portion, the annular portion covering a top surface of the first doped region,
a first gate dielectric layer disposed over the first active region, the first doped region, and the annular portion; and
a first gate disposed over the first gate dielectric layer; and
a second transistor comprising
a second active region;
a second isolation region disposed around the second active region and comprising a pit region;
a second gate dielectric layer disposed over the second active region; and
a second gate disposed over the second gate dielectric layer.

12. The device of claim 11, wherein the first transistor comprises a first width, wherein second transistor comprises a second width, and wherein the first width is smaller than the second width.

13. The device of claim 12, wherein the first active region comprises the first width, and wherein the second active region comprises the second width.

14. The device of claim 13, wherein the first active region and the second active region together comprise the second width.

15. The device of claim 14, wherein the first isolation region comprises a first plurality of trenches, and wherein the second isolation region comprises a second plurality of trenches.

16. The device of claim 15, wherein the first plurality of trenches and the second plurality of trenches comprise a common trench that comprises a part of the annular portion and a part of the pit region.

17. The device of claim 15, wherein the first plurality of trenches comprises a first trench and a second trench and the second plurality of trenches comprise a third trench and the second trench.

18. The device according to claim 2, wherein the semiconductor substrate is an upper semiconductor layer of an SOI structure.

19. The device according to claim 5, wherein the semiconductor substrate is an upper semiconductor layer of an SOI structure.

20. The device according to claim 11, wherein the first and second active regions are disposed an upper semiconductor layer of an SOI structure.

* * * * *